US006733319B1

(12) United States Patent
Jørgensen

(10) Patent No.: US 6,733,319 B1
(45) Date of Patent: May 11, 2004

(54) CONNECTOR AND METHOD FOR ESTABLISHING SOLDERFREE CONNECTIONS BETWEEN A RIGID MAIN PCB AND ASSOCIATED CONDUCTORS

(75) Inventor: Martin Bondo Jørgensen, Smorum (DK)

(73) Assignee: Microtronic A/S, Roskilde (DK)

( * ) Notice: Subject to any disclaimer, the term of this patent is extended or adjusted under 35 U.S.C. 154(b) by 0 days.

(21) Appl. No.: 10/018,506

(22) PCT Filed: Apr. 19, 2000

(86) PCT No.: PCT/DK00/00203

§ 371 (c)(1),
(2), (4) Date: Apr. 1, 2002

(87) PCT Pub. No.: WO00/65692

PCT Pub. Date: Nov. 2, 2000

(30) Foreign Application Priority Data

Apr. 23, 1999 (DK) .................................... 1999 00560

(51) Int. Cl.$^7$ ................................................ H01R 13/62
(52) U.S. Cl. .......................................... 439/329; 439/67
(58) Field of Search ................. 439/329, 493, 439/67, 492, 495, 494, 545, 547, 549, 554, 62, 82, 59

(56) References Cited

U.S. PATENT DOCUMENTS 3,528,050 A     9/1970   Hindenburg
4,116,517 A     9/1978   Selvin et al.
5,240,420 A     8/1993   Roberts
5,383,095 A  *  1/1995   Korsunsky et al. ......... 174/261
5,418,691 A     5/1995   Tokura
5,549,479 A  *  8/1996   Elco et al. ................... 439/267
5,567,167 A  * 10/1996   Hayashi ....................... 439/65
6,089,876 A  *  7/2000   Kuwahara et al. ............ 439/67
6,171,141 B1 *  1/2001   Yasui et al. ................. 439/354
6,285,432 B1 *  9/2001   Phillips ....................... 349/149
6,336,816 B1 *  1/2002   Yatskov et al. ............. 439/493

FOREIGN PATENT DOCUMENTS

| DE | 4136204   | 5/1993  |
| DE | 19753078  | 6/1999  |
| EP | 0162124   | 11/1985 |
| EP | 0397075   | 11/1990 |
| EP | 0431260   | 6/1991  |
| EP | 0674472   | 9/1995  |
| EP | 0704312   | 4/1996  |
| GB | 2183406   | 6/1987  |
| GB | 2296831   | 7/1996  |
| JP | 09018107  | 1/1997  |

* cited by examiner

Primary Examiner—Gary Paumen
Assistant Examiner—Edwin A. León
(74) Attorney, Agent, or Firm—Harness, Dickey

(57) ABSTRACT

A compact connection assembly and a method for establishing solderfree electrical connections between a main PCB and associated conductors e.g. arranged on a flexible foil strip or on a flexible PCB. The connection assembly is particularly suitable for use in compact electronic equipment such as hearing instruments or mobile phones where one can benefit from the small dimensions obtainable by the described connection assembly.

26 Claims, 2 Drawing Sheets

CONNECTOR AND METHOD FOR ESTABLISHING SOLDERFREE CONNECTIONS BETWEEN A RIGID MAIN PCB AND ASSOCIATED CONDUCTORS

FIELD OF THE INVENTION

The present invention relates to a connection assembly and a connection method providing solderfree electrical connections between a number of conductors disposed on a main printed circuit board (main PCB) and associated conductors arranged on e.g. a flexible foil strip or on a flexible PCB. The present invention is particularly well adapted for use in compact electronic equipment such as hearing instruments or mobile phones where one can benefit from the small dimensions obtainable by the present connection assembly.

BACKGROUND OF THE INVENTION

Electronic equipment, such as hearing instruments, mobile phones, medical dispensing devices etc., may require that a number of electrical connections is established between a main PCB and various parts of the equipment, such as electro-acoustic transducers, LCD displays, keyboards, user operated switches and contacts etc. These electrical connections may operate to provide DC voltages and currents, digital data signals, transducer signals etc., from the main PCB to the peripheral units or vice versa.

Each of these parts, from now on referred to as peripheral units, typically comprises a number of electrical terminals which is used to establish the electrical connections to the main PCB and/or a ceramic hybrid circuit provided with corresponding electrical contact pads or terminals.

For hearing instrument applications, peripheral units such as microphone(s), receivers, telecoils etc. are required for audio signal reception and amplification as well as magnetic field reception and amplification.

Furthermore, hearing instruments may also require switches, contacts and programming plugs which are used for a variety of purposes such as turning a battery supply on/off, adjusting the volume, programming of instruments, changing between several pre-programmed listening programs or changing between a microphone and a telecoil audio signal, etc.

The signals provided to or from these peripheral units may comprise signals in a digital or analogue form. A digital signal may represent a logic state or a change of a logic state of a switch, such as a program selector switch, or it may represent digitally encoded analogue transducer signals provided to/from the microphones, receivers etc.

The main PCB of a hearing instrument typically comprises one or several integrated circuits and associated passive components to perform processing and storing of audio or control signals generated by the peripheral units.

Depending on the type of peripheral unit, it may require that two, three or even more terminals are electrically connected to the main PCB. These connections are often provided by means of flexible leads, such as well known litz wires, each lead having a first end soldered at the terminal of the peripheral unit, and having a second end soldered to the corresponding pad or terminal on the main PCB. To ensure that each of these connections is properly made during manufacture or repair of the hearing instrument, several litz wires of differing colour are often provided so that a particular transducer terminal and its corresponding contact pad on the main PCB are associated with a particular wire colour.

Several drawbacks exist in this well-known method of establishing the electrical connections by use of flexible leads between the terminals of the peripheral unit and the pads located on the main PCB.

A first drawback relates to the soldering itself. Since the peripheral units must, generally, be miniature for use in today's in-the-canal (ITC) and compact behind the ear (BTE) types of hearing instruments, the heat capacity of each of the terminals is, inherently, very small. The small heat capacity requires very strict monitoring of soldering temperature and soldering time to avoid overheating the terminals, which in worst case could destroy the operation of the peripheral unit, or at least severely damage the reliability. Furthermore, transducers are often provided with integrated circuits within their housings or casings and these integrated circuits are electrically and thermally connected to the transducer terminals. Consequently, overheating these transducer terminals may conduct sufficient heat to the integrated circuits to melt bonding wires and/or overheat the integrated circuits themselves. Obviously, similar soldering related problems also exist during soldering on the contact or connection pads arranged on the main PCB of a hearing instrument or of another compact electronic device.

Accordingly, overheating transducer or switch terminals is a serious problem, particularly during service in repair shops but also during factory assembly of the hearing instruments.

A second drawback related to the use of the flexible leads to provide the required electrical connections between the peripheral units and a PCB of e.g. a hearing instrument is that an operator may need to find and consult a wiring diagram in e.g. a repair manual to determine the correct connection pad for a given wire.

In some situations, the widespread use of litz wires as electrical leads may generate problems in the hearing instrument assembly or repair process, since this type of wire is prone to mechanical damage that often results in detachment of noninsulated strands of wires from the wire core. These strands may establish unintended connections to circuitry and/or terminals within the hearing instrument, and thus leave the hearing instrument in a non-operational state.

Another drawback of using flexible leads is that the leads are unsuited for automated machine assembly. Consequently, human operators are required to carry out the process of soldering and correctly connecting the leads between corresponding terminals or pads on the peripheral unit and on the main PCB.

Accordingly, it would be desirable to provide a method which is capable of establishing solderfree electrical connections between the terminals of a peripheral unit and connection pads of a PCB of an electronic device or apparatus, such as a hearing instrument, a mobile phone, a medical dispensing apparatus etc. Likewise, it would also be desirable to provide a, preferably compact, connection assembly adapted for utilisation in such a connection method.

U.S. Pat. No. 4,116,517 discloses a connection assembly providing solderfree electrical connections between a number of hollow contact pads arranged on a flexible circuit board or strip, and a corresponding number of exposed metallic pads or traces on a PCB. The hollow contact points on the flexible circuit strip are filled with an elastomeric material, thereby forcing these contact points against the pads on the PCB. Screws and nuts are used to keep the two boards properly aligned and the pads in electrical contact.

DE 41 36 204 A1 discloses a method of providing solderfree electrical connection between a number of conductors in flexible ribbon cable and a corresponding number of exposed metallic pads on a PCB. The contact points of the PCB and ribbon cable are kept in electrical contact by a clamping element secured by screws and nuts to the PCB.

However, these prior-art methods of providing solderfree electrical connections share a common drawback due to their requirement of allocating a significant area of the PCB to the screws and nuts. Furthermore, the assembling and fastening procedure required for the screws and nuts may require manual operation steps which are time consuming and therefore adds to the cost of an apparatus utilising such methods. Within housings of miniature electronic equipment such as hearing instruments, the space required to handle or operate tools for assembling the screws and nuts may not be available. Consequently, none of these connectors and connection methods are fully suitable for application in miniature or compact electronic equipment.

SUMMARY OF THE INVENTION

It is an object of the present invention to solve the above-mentioned problems by providing a compact connection assembly establishing a solderfree electrical connections between a peripheral unit and a PCB of an electronic apparatus, such as a hearing instrument, a mobile phone, a medical dispensing device, or other electronic equipment.

It is a further object of the present invention to provide a connection assembly that operates without using screws and nuts so as to avoid the above mentioned drawbacks of these elements.

It is a still further object of the present invention to solve the problems associated with soldering on the terminals of the peripheral units by providing a connection assembly comprising a peripheral unit which is integrated with the flexible printed circuit strip or flexible foil strip.

Furthermore, problems related to the use of flexible leads, such as litz wires, can be solved by one embodiment of the present invention wherein leads are replaced with a flexible printed circuit strip or flexible foil strip comprising two or more electrical conductors.

In a first aspect, the present invention relates to a connection assembly being adapted to maintain electrically conducting contact pads of a PCB and exposed parts of a member in a predetermined alignment, said connection assembly comprising a U-shaped clamp comprising two leg parts and a back part, wherein the back part of the clamp comprises an aperture being adapted to receive a first end of the member, and wherein the leg parts of the clamp are positioned with a predetermined spacing so as to obtain electrical contact between the contact pads of the PCB and the exposed parts of the member when the contact pads and the exposed parts are aligned with respect to each other.

The term "clamp" is to be understood in a broad sense in the present context. Thus, "clamp" may designate various devices having two leg parts and a back part and that are capable of applying a force between the member and the PCB, thereby clamping together the contact pads and the exposed parts. The embodiment of the clamp shown in FIG. 1 also possess functional features similar to those of a bushing, e.g. the aperture in the back part allowing insertion of the member.

Each of a number of electrical signals may be provided on a corresponding electrical conductor, which is comprised within or disposed on the member that may be a flexible foil strip or a strip of flexible PCB. These conductors may be covered by an insulating mask, which protects them from corrosion and physical damage. In order to provide an electrical connection pad to the conductor, an exposed part may be provided by forming an aperture in the insulating mask of each conductor at the first end of the member. By forming a number of aligned apertures a number of exposed parts acting as connection pads or terminals is provided on the member. These connection pads are typically formed only on one side of the member while the conductors on other side may be rendered completely covered by the insulating mask.

The member may be inserted into an aperture provided in the back part of the U-shaped clamp by an operator. The exposed parts will be aligned with respect to the corresponding electrically conducting contact pads arranged on the main PCB. After the pads have been correctly aligned, the member may be positioned on top of the PCB and the two items may be clamped together so that electrical connection is established between a contact pad and a corresponding exposed part. Subsequently, by sliding the clamp along the member towards the main PCB, the clamp may be positioned with the first leg part on top of the member, and the second leg part on the backside of the main PCB. The predetermined spacing between the leg parts of the clamp is chosen so that the U-shaped clamp provides a predetermined spring force between the main PCB and the member, thereby clamping them together. Accordingly, a predetermined contact force is established between the exposed parts on the member and the contact pads on the main PCB. The value of this contact force is selected according to the dimensions of the connection assembly and additional requirements specific for the particular application in question.

A U-shaped clamp adapted for hearing instrument applications may have dimensions of about 1–5 mm and the provided contact force is, preferably, selected in the range 0.2–2.0 Newton, preferably between 0.5–1.0 Newton for each pair of contact elements constituted by a contact pad and its corresponding exposed part.

Correct alignment between the pairs of corresponding contact elements may be provided and secured in a number of ways.

According to one embodiment of the invention, one of the leg parts of the U-shaped clamp comprises a central groove and two outer parts extending from the back part aperture towards the end of the leg part, whereby the predetermined spacing exists between the central part and the other leg part. This central groove may be manufactured with a width substantially equal to a width of a flexible foil strip that may constitute the member. Thereby the flexible foil strip may be steered or guided in a predetermined alignment with respect to the clamp, consequently, the contact pads arranged on the main PCB and the exposed parts provided on the flexible foil follow this steering.

According to another embodiment, the aperture in the U-shaped clamp has a width substantially equal to the width of the member. Thereby, the exposed parts of the member may be aligned in a predetermined manner with respect to the U-shaped clamp. The dimensions of the aperture are adapted to the width of the member so that during mounting of the connection assembly, the aperture aligns the member when inserted in/through the aperture in the back part of the clamp. Consequently, this embodiment facilitates correct alignment of the exposed parts on the member with respect to the corresponding contact pads on the main PCB.

As detailed above, several methods exist for aligning the member correctly with respect to the U-shaped clamp, it is, however, also necessary to resolve the problem of how to correctly align the U-shaped clamp and the main PCB with respect to each other. According to one embodiment, this alignment may be established by providing a set of corresponding engaging means, a first engaging means provided on the PCB and a second engaging means provided on a leg part of the U-shaped clamp, whereby the contact pads and the exposed parts may be aligned with respect to each other when the set of engaging means are engaged.

Accordingly, either the upper and/or lower surface of the PCB may be provided with a groove or an indentation preferably extending substantially in a parallel or perpendicular direction to the edge contour of the main PCB. Similarly, the upper and/or lower leg part of the clamp may comprise a corresponding projection(s) adapted to engage with the groove or indentation. Naturally, different sets of corresponding engaging means may also be utilised for alignment, one or several pins on one of the leg parts of the clamp may engage with a corresponding aperture(s) provided on the main PCB.

According to a preferred embodiment of the invention, the alignment is provided by a projection comprised on an inner surface of a leg part of the U-shaped clamp and by providing the conducting contact pads as plated thru-holes forming an indentation being adapted to engage with the projection so as to provide a snap-connection between the clamp and the PCB. Accordingly, the plated thru-holes may function as an indentation arranged on an upper surface of the main PCB and may extend in a direction substantially parallel to an edge contour of the PCB. The upper leg part of the clamp may in this situation comprise a projection adapted to engage with the indentation formed by the plated thru-holes. This embodiment has the advantage that the plated thru-holes serve a double purpose—they provide an alignment indentation enabling the snap-connection and they provide the conducting contact pads required to establish the electrical connection to the conductors of the main PCB. Furthermore, the plated thru holes may be manufactured during already existing processing steps of the main PCB, i.e. they do not require new process steps to be added to the manufacturing process.

According to a preferred embodiment of the invention, the correct alignment of the U-shaped clamp with respect to the main PCB is provided by manufacturing the main PCB with an indentation of substantially same width as the width of the U-shaped clamp. Accordingly, when the clamp is inserted into this indentation after the member has been inserted into the back part aperture of the clamp, the clamp is correctly aligned with respect to the main PCB and the exposed parts on the member are correctly aligned with respect to the corresponding contact pads provided on the main PCB. Thus, when the clamp slides forward so as to engage with the main PCB and clamp together the member and the PCB, the projection that may be comprised on the upper leg part will snap onto the corresponding indentation formed by the plated thru-holes provided on the main PCB, thereby locking the position of the exposed parts on the member correctly relative to the corresponding contact pads on the PCB.

Preferably, the depth of the U-shaped clamp is adapted to the dimensions of the indentation in the circuit board so as to substantially align the back part of the clamp with the edge contour of the PCB when the contact pads and the exposed parts are aligned with respect to each other.

According to one embodiment of the invention, at least one of the leg parts of the U-shaped clamp comprises means for receiving an operators nail, thereby enabling disassembly of the connection assembly by an operator/technician without use of specialised tools, such as miniature screwdrivers, tweezers etc.

The U-shaped clamp may be manufactured in stainless steel or in a thermoplastic material with or without reinforcement. In some applications it may be advantageous to use a clamp of a thermoplastic material due to its electrically insulating properties. This could be the situation where the member was provided with exposed conductors on the backside (the side reverse to the side comprising the exposed parts). In other applications, the conductors on the backside could be covered with an insulating mask and, accordingly, the clamp may be provided in stainless steel. Stainless steel may be advantageous for some applications due to its high strength, whereby a required clamping force may be provided by a clamp of small dimensions.

In this context it should be noted that the predetermined spacing between the leg parts and the clamp material must be selected so that the contact force acting upon the member and the main PCB meets the requirements of the particular application. The requirements to the contact force may depend on the mechanical stress level acting on the connection assembly due to factors such as structural vibrations and bending forces. A connection assembly adapted to hearing instrument applications has, preferably, outer dimensions of about 1–5 mm and a predetermined spacing between the leg parts of about 0.1–1.0 mm, more preferably between 0.3 and 0.6 mm. Thereby, a contact force of about 0,1–1.0 Newton for each pair of corresponding pads and exposed parts may be generated through appropriate selection of material.

The member may comprise a flexible printed circuit strip or board or a flexible foil strip or any other suitable carrier adaptable to comprise one or several electrical conductors. Alternatively, the member may comprise a flexible ribbon cable where the exposed parts could be formed by removing the insulating material from each conductor at one end of the ribbon cable.

According to a preferred embodiment of the invention, a second end of the member is electrically connected to, or integrated with, an electro-acoustic transducer, a switch or a potentiometer. This embodiment is particularly suitable for hearing instrument applications, since a technician may replace a defective peripheral unit without having to solder inside the hearing instrument housing or on the transducer terminals. The skilled person will appreciate that this is a major advantage provided by the present invention, since the previously mentioned hazards of soldering on transducer terminals or on the contact pads of the main PCB within a hearing instrument casing are eliminated.

Furthermore, this embodiment additionally provides the advantage of providing a convenient and solderfree method of replacing one type of peripheral unit with different types whereby acoustical properties and/or functional features of a hearing instrument may be customised to the wishes and/or requirements of a particular hearing instrument user.

In a second aspect, the present invention relates to a method of providing solderfree electrical connections between pairs of corresponding electrical terminals, the method comprising the steps of:

providing a PCB having at least two conductors disposed on a surface thereof, each conductor comprising an electrically conducting contact pad, providing a member comprising at least two conductors, each conductor having an exposed part at a first end of the member, providing a U-shaped clamp comprising two leg parts and a back part, the back part comprising an aperture which is adapted to receive the first end of the member, the two leg parts being separated with a predetermined spacing, inserting the member into the aperture in the back part and positioning pairs of the corresponding contact pads and exposed parts in alignment, and sliding the clamp along the member towards the PCB until the clamp is positioned with the first leg part on top of the member, and the second leg part abutting the backside of the PCB.

Accordingly, the second aspect of the invention relates to a method of establishing solderfree electrical connections between conductors arranged on e.g. a PCB and corresponding conductors comprised on e.g. a flexible PCB. The method utilises a U-shaped clamp which is adapted to clamp together the PCB and the member. The method avoids the use of screws and nuts or similar fastening and/or engaging means which typically occupy significant area of PCBs as well as housing volume. Accordingly, the method is particularly well suited for applications in electronic equipment where it is a key requirement to minimise the use of PCB area and the use of interior housing volume. Such requirements often prevail within compact electronic equipment, such as hearing instruments, mobile phones, medical dispensing devices, etc.

The method according to the second aspect may further comprise the steps of providing exposed parts having a length in the longitudinal direction of the member longer than the length of each corresponding contact pad, positioning the pairs of corresponding contact pads and exposed parts in width-wise alignment, and removing a residual part of the member extending longitudinally across an upper surface of the PCB.

The width-wise direction is in this context the direction substantially perpendicular to the longitudinal direction of the member and to the conductors of the member.

The advantage of this method is that there is less strict requirements regarding the longitudinal direction alignment of the pairs of corresponding contact pads and exposed parts since the exposed parts may be provided with a length of 1–10 times the length of the contact pads, preferably 1.5–6 times the length of the contact pads, even more preferably between 2 and 4 times the length of the contact pads.

BRIEF DESCRIPTION OF THE DRAWINGS

Hereunder, a preferred embodiment of an a connection assembly according to the invention is described with reference to the drawing, wherein.

DETAILED DESCRIPTION OF A PREFERRED EMBODIMENT

Figure 1:
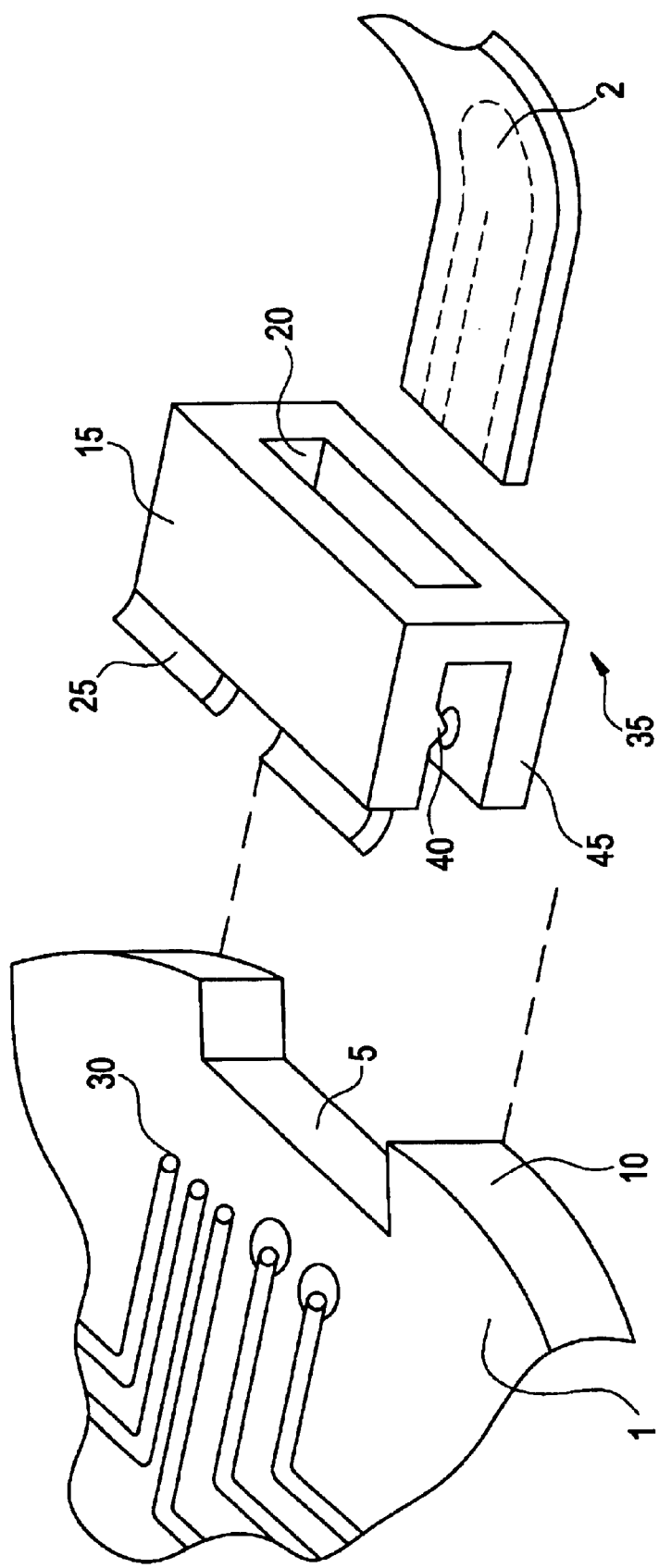
FIG. 1 is a perspective view illustrating the parts comprised in the electromechanical encoder according to the present invention.

FIG. 1 shows a perspective view of a connection assembly according to the present invention and adapted for use in BTE, ITC and CIC types of hearing instruments. The connection assembly comprises a main PCB 1 within a hearing instrument housing (not shown). Five plated thru holes 30 are arranged on the upper surface of the main PCB 1 and extend in a direction substantially parallel to the edge contour 10 of the PCB 1 so that an indentation is formed in the surface of the main PCB 1. An upper leg part 15 of a U-shaped clamp 35 comprises a projection 40 adapted to engage with the indentation formed by the plated thru holes 30. A predetermined spacing exists between the upper leg part 15 and the lower leg part 45 of the clamp. Receivers 25 are adapted to receive an operator's nail. The receivers 25 protrude from at least one of the leg parts of the U-shaped clamp e.g. the upper leg part 15, thereby making it easier to disengage the clamp 35 such that said clamp may be removed from an indentation 5.

This spacing is preferably about 0.3–0.6 mm when the nominal thickness of the main PCB is about 0.3 mm and the nominal thickness of a flexible circuit board 2 is about 0.1 mm. Preferred dimensions of the clamp in the present embodiment are: depth=0.8 mm, width=0.7 mm.

The back part of the clamp 35 comprises an aperture 20 having a width substantially equal to the width of the flexible circuit board 2 so that the aperture aligns the flexible circuit board 2 with respect to the clamp 35 when the flexible circuit board 2 has been inserted through the aperture 20 in the back part of the clamp.

The clamp is, preferably, provided in a thermoplastic material since a low cost injection moulding manufacturing process may then be utilised.

Figure 2A:
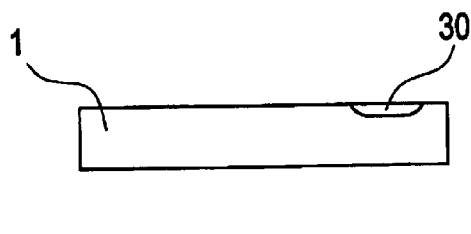
FIGS. 2A–2E illustrate the method according to the present invention.
Figure 2B:
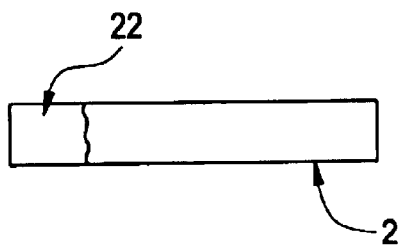
Figure 2C:
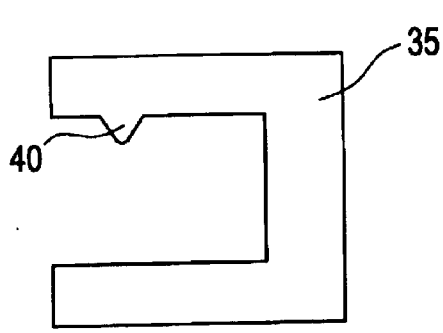
Figure 2D:
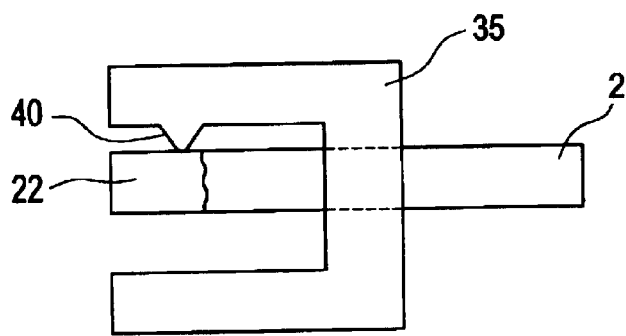
Figure 2E:
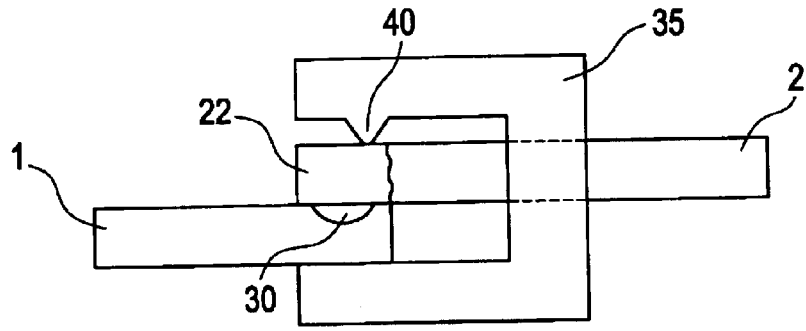

FIGS. 2A–2E illustrate the method of the preset invention wherein FIGS. 2A–2C illustrate the PCB 1, the flexible circuit board 2 (including exposed part 22), and the clamp 35, respectively. In FIG. 2D, the flexible circuit board 2 in inserted in the aperture 20 of the clamp 35, and in FIG. 2E, the clamp 35 is slid along the flexible circuit board 2 toward the PCB 1 until the clamp 35 is positioned with the upper leg part 15 on top of the flexible circuit board 2 and the lower leg part 45 abutting the backside of the PCB 1, and so that the projection 40 engages the through hole 30.

What is claimed is:

1. A connection assembly being adapted to maintain a PCB's electrically conducting contact pads, provided as plated thru-holes forming grooves, and exposed parts of a member in a predetermined alignment, said connection assembly comprising:

a U-shaped clamp manufactured in one piece in a thermoplastic and resilient material and comprising two leg parts and a back part, wherein the back part of the clamp comprises an aperture being adapted to receive a first end of the member, and wherein the leg parts of the clamp are positioned with a predetermined spacing so as to obtain electrical contact between the contact pads of the PCB and the exposed parts of the member when the contact pads and the exposed parts are aligned with respect to each other, and wherein an inner surface of one of the leg parts comprises a projection being adapted to engage with a groove so as to provide a snap-connection between the clamp and the PCB; and wherein the snap-connection provides a physical connection between the clamp and the PCB.

2. A connection assembly according to claim 1, wherein one of the leg parts comprises a central groove and two outer parts extending from the back part aperture towards the end of the leg part.

3. A connection assembly according to claim 1, wherein the aperture in the U-shaped clamp has a width substantially equal to a width of the member, thereby aligning the contact pads and the exposed parts with respect to each other.

4. A connection assembly according to claim 1, wherein the PCB and a leg part of the U-shaped clamp comprises engaging means being adapted to align the contact pads and the exposed parts with respect to each other.

5. A connection assembly according to claim 1, wherein at least one of the leg parts of the U-shaped clamp comprises means for receiving an operators nail.

6. A connection assembly according to claim 1, wherein the member comprises a flexible printed circuit strip or board.

7. A connection assembly according to claim 1, wherein the member comprises a flexible foil strip.

8. A connection assembly according to claim 1, wherein a second end of the member is electrically connected to, or integrated with, an electro-acoustic transducer, a switch or a potentiometer.

9. A connection assembly according to claim 1, wherein the assembly is utilised in a hearing instrument or a telecommunication unit, such as a mobile telephone.

10. A connection assembly according to claim 1, wherein a largest dimension of the clamp is less than 5 mm.

11. A connection assembly according to claim 1, wherein the predetermined spacing between the leg parts is between 0.1 and 1.0 mm.

12. A connection assembly according to claim 1, wherein the PCS is provided with an indentation of substantially a same width as the width of the U-shaped clamp.

13. A connection assembly according to claim 12, wherein the back part of the U-shaped clamp has a thickness substantially equal to a depth of the indentation in the PCB so as to align the back part of the clamp with the contour of the PCB.

14. A method of providing solderfee electrical connections between pairs of corresponding electrical terminals, the method comprising the steps of:

providing a PCB having at least two conductors disposed on a surface thereof, each conductor comprising an electrically conducting contact pad provided as a plated thru hole forming a groove, providing a member comprising at least two conductors, each conductor having an exposed part at a first end of the member, providing a U-shaped clamp made in one piece of a thermoplastic and resilient material and comprising a first and a second leg part and a back part, the back part comprising an aperture which is adapted to receive the first end of the member, the two leg parts being separated with a predetermined spacing, an inner surface of one of the leg parts comprising a projection adapted to engage with a groove so as to provide a snap-connection between the clamp and the PCB, inserting the member into the aperture in the back part and positioning pairs of the corresponding contact pads and exposed parts in alignment, and sliding the clamp along the member towards the PCB until the clamp is positioned with the first leg part on top of the member, and the second leg part abutting the backside of the PCB, and so that said projection engages said groove;

wherein an interaction between said projection and said grove provides a physical connection between the clamp and the PCB.

15. A method according to claim 14, further comprising the steps of providing exposed parts having a length in the longitudinal direction of the member longer than the length of each corresponding contact pad, positioning the pairs of corresponding contact pads and exposed parts in width-wise alignment, and removing a residual part of the member extending longitudinally across an upper surface of the PCB.

16. A connection assembly comprising:

a U-shaped clamp manufactured in one piece in a thermoplastic and resilient material and comprising two leg parts, a back part, and at least one protrusion wherein the back part of the clamp includes an aperture being adapted to receive a first end of a member, and wherein the leg parts of the clamp are positioned with a predetermined spacing so as to obtain electrical contact between contact pads of a PCB and exposed parts of the member when the contact pads and the exposed parts are aligned with respect to each other;

wherein an inner surface of one of the leg parts includes a projection being adapted to engage with a groove so as to provide a snap-connection between the clamp and the PCB; and wherein the at least one protrusion is operable by an operator's fingernail to disassemble the clamp and the PCB.

17. A connection assembly according to claim 16, wherein the at least one protrusion includes two protrusions.

18. A connection assembly according to claim 16, wherein the at least one protrusion extends from one of the leg parts.

19. A connection assembly according to claim 16, wherein the at least one protrusion extends in a direction substantially parallel to an edge contour of the PCB.

20. A connection assembly according to claim 16, wherein the at least one protrusion is curved.

21. A method of disassembling a connection assembly including a PCB having at least two conductors disposed on a surface thereof, each conductor including an electrically conducting contact pad provided as a plated through hole forming a groove, a member including at least two conductors, each conductor having an exposed part at a first end of the member, and a U-shaped clamp, made in one piece of a thermoplastic and resilient material and including a first and a second leg part, a back part, and at least one protrusion wherein the back part of the clamp includes an aperture being adapted to receive a first end of the member, and wherein the leg parts of the clamp are positioned with a predetermined spacing so as to obtain electrical contact between the contact pads of the PCB and exposed parts of the member when the contact pads and the exposed parts are aligned with respect to each other, wherein an inner surface of one of the leg parts includes a projection being adapted to engage with a groove so as to provide a snap-connection between the clamp and the PCB, said method comprising:

operating the at least one protrusion to disassemble the clamp and the PCB.

22. A method according to claim 21, wherein the at least one protrusion is operated by an operator's fingernail.

23. A connection assembly according to claim 21, wherein the at least one protrusion includes two protrusions.

24. A connection assembly according to claim 21, wherein the at least one protrusion extends from one of the leg parts.

25. A connection assembly according to claim 21, wherein the at least one protrusion extends in a direction substantially parallel to an edge contour of the PCB.

26. A connection assembly according to claim 21, wherein the at least one protrusion is curved.

* * * * *

UNITED STATES PATENT AND TRADEMARK OFFICE
CERTIFICATE OF CORRECTION

PATENT NO. : 6,733,319 B1  Page 1 of 1
DATED : May 11, 2004
INVENTOR(S) : Martin Bondo Jøgensen It is certified that error appears in the above-identified patent and that said Letters Patent is hereby corrected as shown below:

<u>Title page,</u>
Item [73], Assignee, should read -- Sonionmicrotronic A/S, Roskilde, Denmark (DK) --.

Signed and Sealed this

Sixteenth Day of May, 2006

JON W. DUDAS
*Director of the United States Patent and Trademark Office*